US012719428B2

(12) United States Patent
Coln et al.

(10) Patent No.: US 12,719,428 B2
(45) Date of Patent: Aug. 25, 2026

(54) ENHANCED AUTO-ZERO CIRCUIT

(71) Applicant: Analog Devices, Inc., Wilmington, MA (US)

(72) Inventors: Michael C.W. Coln, Lexington, MA (US); Qingdong Meng, Belmont, MA (US); Phillip Michel Nadeau, Cambridge, MA (US)

(73) Assignee: Analog Devices, Inc., Wilmington, MA (US)

( * ) Notice: Subject to any disclaimer, the term of this patent is extended or adjusted under 35 U.S.C. 154(b) by 533 days.

(21) Appl. No.: 18/202,241

(22) Filed: May 25, 2023

(65) Prior Publication Data

US 2024/0396510 A1 Nov. 28, 2024

(51) Int. Cl.
*H03F 3/45* (2006.01)

(52) U.S. Cl.
CPC ... *H03F 3/45475* (2013.01); *H03F 2200/375* (2013.01)

(58) Field of Classification Search
CPC ............. H03F 3/45475; H03F 3/45977; H03F 2200/375; H03F 2203/45212; H03F 2203/45514; H03F 2203/45551
USPC ..................................................... 330/260, 9
See application file for complete search history.

(56) References Cited

U.S. PATENT DOCUMENTS

| | | | |
|---|---|---|---|
| 5,796,300 | A | 8/1998 | Morgan |
| 2009/0273386 | A1 | 11/2009 | Korobeynikov et al. |
| 2009/0273392 | A1 | 11/2009 | Korobeynikov et al. |

OTHER PUBLICATIONS

"European Application Serial No. 24175437.3, Extended European Search Report mailed Oct. 11, 2024", 16 pgs.
"European Application Serial No. 24175437.3, Response filed Feb. 7, 2025 to Extended European Search Report mailed Oct. 11, 2024", 16 pgs.

*Primary Examiner* — Andrea Lindgren Baltzell
*Assistant Examiner* — Nareh Shamiryan
(74) *Attorney, Agent, or Firm* — Schwegman Lundberg & Woessner, P.A.

(57) ABSTRACT

An enhanced auto-zero circuitry and technique for reducing the effective input offset voltage of an amplifier. The circuitry includes a multi-phase auto-zeroing amplifier circuitry including several capacitor and switch components and a switch controller circuit. The switch controller circuit is configured to provide control signals for controlling the switches, where during a first sub-phase of an auto-zero phase, multiple switches are turned on to store an amplifier input offset coarser compensation charge on the input capacitor, and where during a second sub-phase of the auto-zero phase, at least one switch is turned off before turning on another switch to store an amplifier input offset finer compensation charge on the input capacitor via the first auto-zero capacitor.

20 Claims, 7 Drawing Sheets

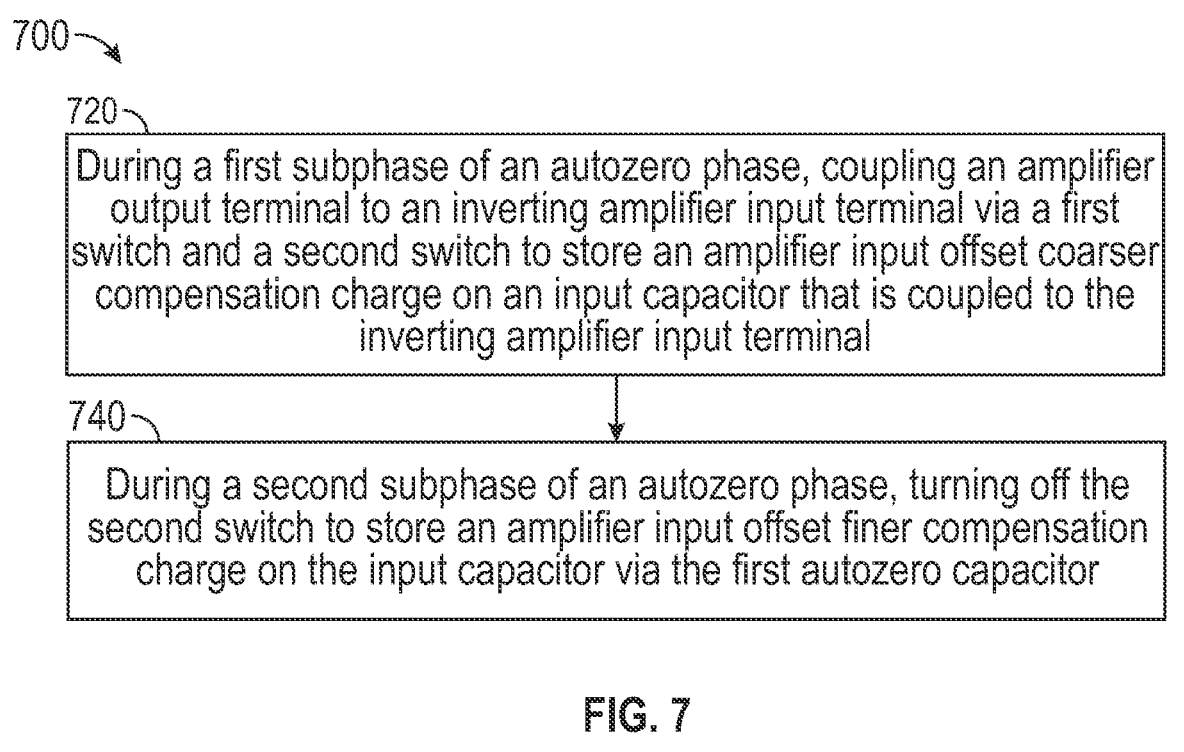

700

720

During a first subphase of an autozero phase, coupling an amplifier output terminal to an inverting amplifier input terminal via a first switch and a second switch to store an amplifier input offset coarser compensation charge on an input capacitor that is coupled to the inverting amplifier input terminal

740

During a second subphase of an autozero phase, turning off the second switch to store an amplifier input offset finer compensation charge on the input capacitor via the first autozero capacitor

FIG. 7

ENHANCED AUTO-ZERO CIRCUIT

TECHNICAL FIELD

The present disclosure relates to techniques for reducing the effective input offset voltage of an amplifier using auto-zero circuitry.

BACKGROUND

Input offset voltage is an important parameter for many DC-coupled signal chains. Offset can be particularly problematic when the signals being processed are small, and where uncertainty in the offset voltage can confound any estimate of the actual signal. Excessive input offset can also impact the signal source. For example, when analog front-end (AFE) circuitry is operating as a trans-impedance stage, the intent is that the input node of an AFE transimpedance amplifier perform as a "virtual ground", at which the signal source "sees" a negligible voltage potential with respect to a "signal ground". If the signal source is not a perfect current source and has less than infinite impedance, amplifier input offset voltage in the AFE circuitry can lead to an error current superimposed on the actual signal.

However, some AFE circuits suffer from imperfect input offset. For example, transistor differential-pair topologies can be used in the AFE circuitry, especially in amplifier circuits. A differential-pair input may reject predictable common-mode input voltages, including those from transistor threshold voltages, but cannot perfectly reject mismatches between the devices, whether due to manufacturing imperfections, parametric differences, or device noise. Therefore, there is a need for a circuit topology that can reduce the effective input offset voltage of a signal chain.

Approaches for reducing input offset voltage can include "chopping" and "auto-zeroing". Both involve adding switches and operating these switches in a periodic fashion. Chopping operates switches on the input of the AFE as a modulator, so that the signal spectrum of interest is mapped to a different part of the frequency spectrum.

Auto-zeroing is somewhat easier to visualize in the time domain. For example, a collection of switches is used to operate the AFE circuitry in two alternating phases. The first (auto-zeroing) phase effectively involves sampling the response of the core circuitry with zero input, or no signal present, while the second (operational) phase includes the addition of the desired input signal. Subtracting the AFE response during the first phase from the response during the second phase results in the desired response due to the input signal alone.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 7 illustrates a flow diagram of portions of a method of auto-zeroing an amplifier using multiple auto-zero sub-phases to compensate for an input offset voltage of the amplifier.

DETAILED DESCRIPTION

This document describes, among other things, enhanced auto-zero circuitry and techniques for reducing the effective input offset voltage of an amplifier using multi-phase auto-zeroing.

Figure 1:
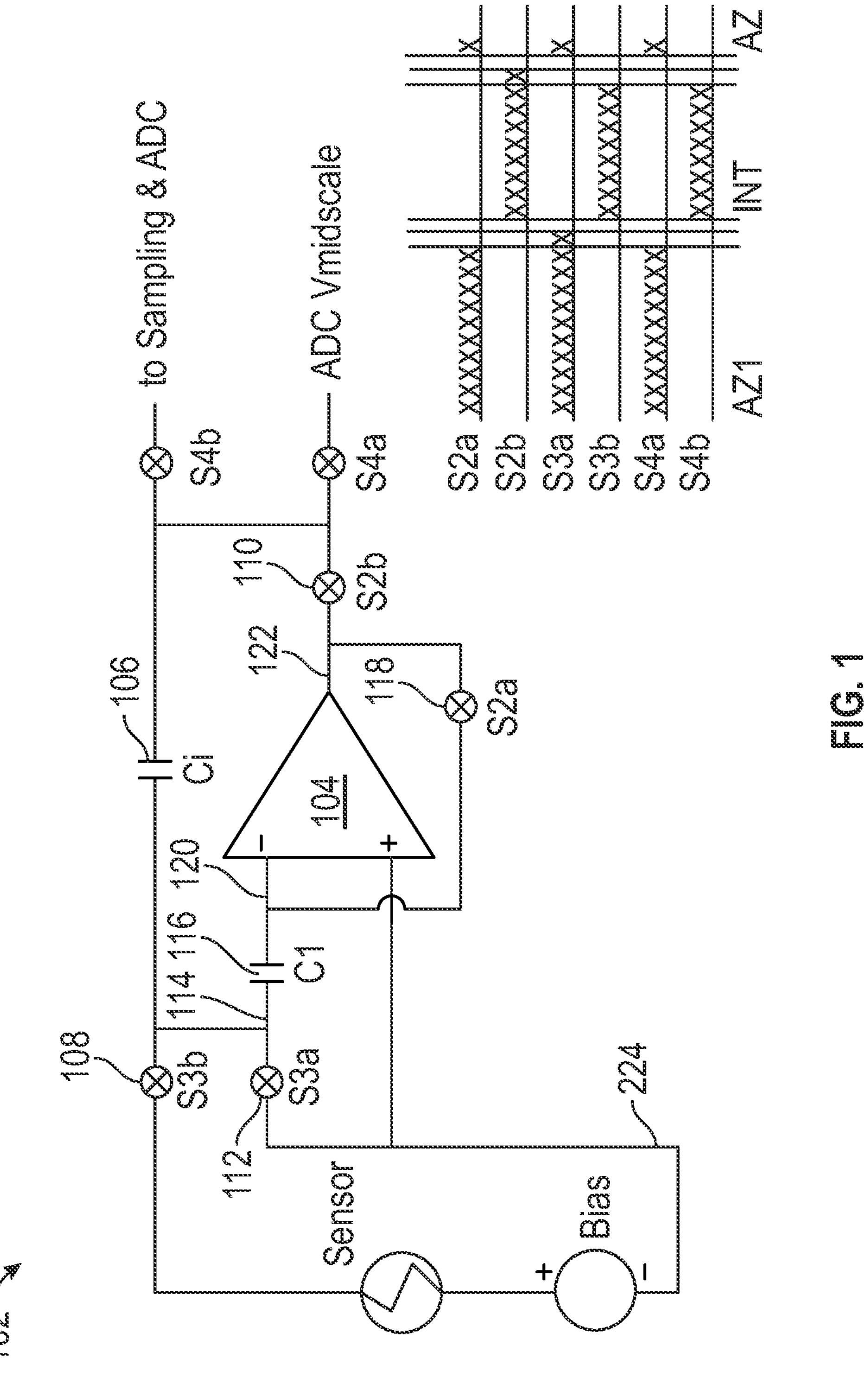
FIG. 1 illustrates a schematic diagram of an auto-zero amplifier.

FIG. 1 illustrates a schematic diagram of an approach to an auto-zero amplifier. The schematic includes an integrator analog front-end (AFE) with an integration capacitor 106. In this approach, during "phase one", or auto-zero phase, switch 3*b* 108 and switch 2*b* 110 are off, and switch 3*a* 112 is on to apply a zero (or other stable reference) voltage at node 114 input to the AFE, or the left side of the integration capacitor 106 and the left side of the input capacitor 116. Concurrently, during the auto-zero phase, switch 2*a* 118 is also on to convey the output voltage from the amplifier 104 as unity-gain negative feedback to the inverting input 120 of the amplifier 104, such that the "offset voltage" of the amplifier 104 is stored on the input capacitor 116. Thus, at the end of the auto-zero phase, the voltage stored on the input capacitor 116 will settle to a close approximation of the underlying amplifier input offset voltage. The switch 2*a* 118 then switches off, to capture this sample of the AFE input offset voltage, thereby completing the auto-zero phase.

For "phase two", or a signal integration (or other signal processing) phase, the switch 3*a* 112 is turned off, switch 3*b* 108 is turned on to now apply the actual signal input to the AFE via the input capacitor 116, and switch 2*b* 110 is turned on to connect the output 122 of the amplifier 104 to the integration capacitor 106 for operating as an integrator. The stored input offset voltage on the input capacitor 116 tends toward cancelling the underlying AFE input offset voltage. Therefore, the output 122 of the amplifier 104 should only contain the amplifier 104 response to the desired input signal, without integrating the AFE underlying input offset, as desired.

In practice, there are confounding factors that limit the performance of the auto-zero topology depicted in FIG. 1 First, when switch 2*a* 118 is turned off at the end of phase one, the channel charge in the field-effect transistor (FET) of switch 2*a* 118, and any charge coupled from switch 2*a* 118 gate, will lead to some "extra" charge being deposited on input capacitor 116, therefore causing a "pedestal" error. This will lead to an imperfect estimate of the AFE underlying input offset voltage being stored on input capacitor 116, and thus imperfect cancellation of that input offset voltage during phase two. Furthermore, the "sampling" of the estimated offset voltage for storage onto input capacitor 116 will be subject to "sampling noise" (kT/C), resulting in an added "offset noise" contribution to the final output voltage during phase two. An auto-zero circuit topology that seeks to reduce both of these confounding factors would be desirable.

Figure 2:
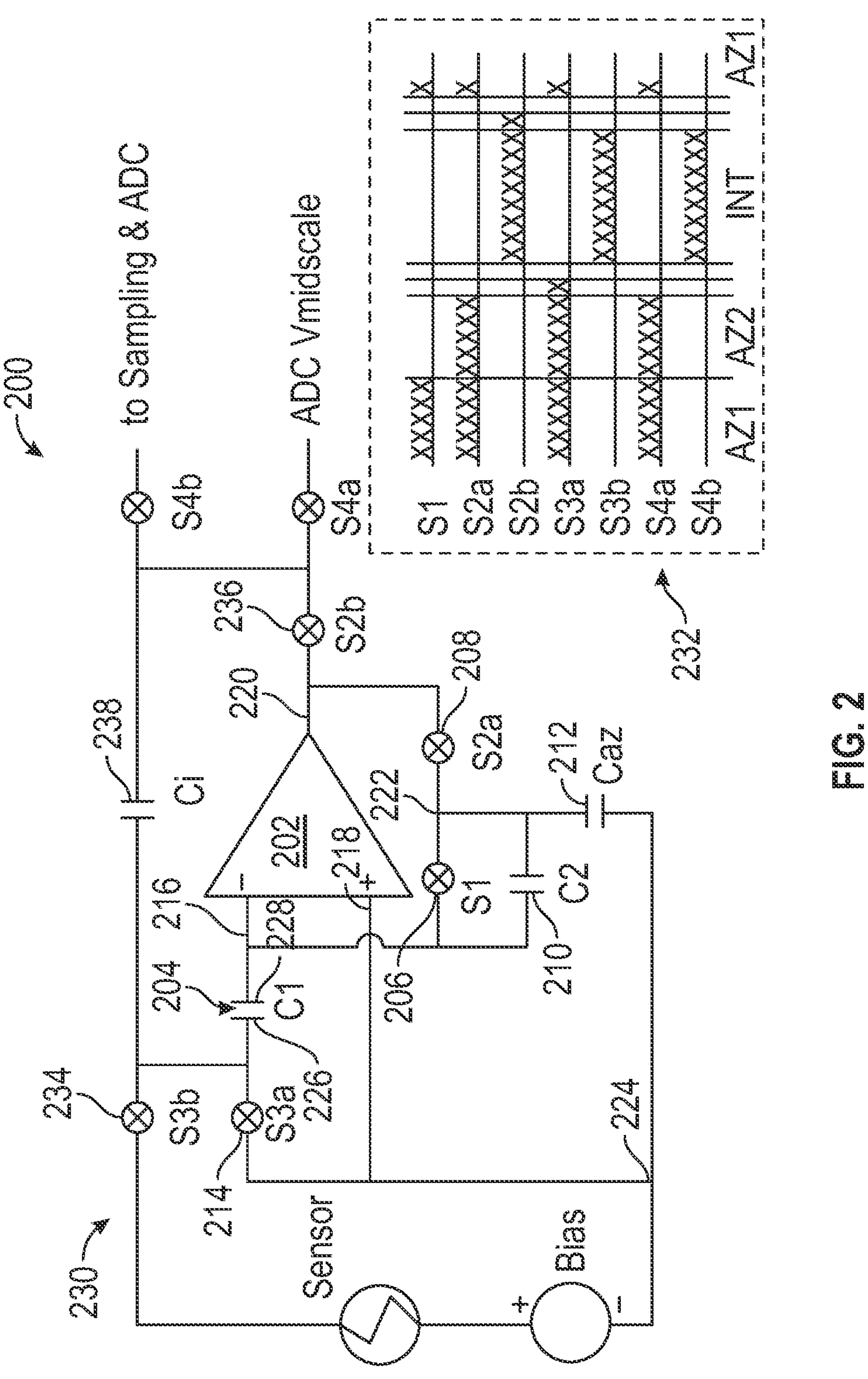
FIG. 2 illustrates a schematic diagram of the multi-phase auto-zeroing amplifier circuitry with timing control.

FIG. 2 illustrates a schematic diagram of a multi-phase auto-zeroing amplifier circuitry 200 and an associated timing control diagram, which is superimposed upon a dashed block representing switch controller circuitry 232. The multi-phase auto-zeroing amplifier circuitry 200 may include an amplifier 202 comprising an inverting amplifier input terminal 216, a non-inverting amplifier input terminal 218, and an amplifier output terminal 220. The amplifier 202 can be configured as one of a transconductance amplifier stage or a transimpedance amplifier stage, such as when the input signal is received as an input current signal from a current mode sensor. The multi-phase auto-zeroing amplifier circuitry 200 may further include a first auto-zeroing network 230. The first auto-zeroing network 230 may include an input capacitor 204, having a first input capacitor terminal 226 and a second input capacitor terminal 228. The second input capacitor terminal 228 may be coupled to the inverting amplifier input terminal 216.

The first auto-zeroing network 230 may also include at least a first switch 206 and a second switch 208 but may include one or more additional switches. The first switch 206 and the second switch 208 may be connected in series between the inverting amplifier input terminal 216 and the amplifier output terminal 220, such as to define a first intermediate node 222 therebetween. A first auto-zero capacitor 210 may be connected between the inverting amplifier input terminal 216 and the first intermediate node 222. A second auto-zero capacitor 212 may be connected between the first intermediate node 222 and a first reference node 224. An input auto-zero switch 214 may be coupled between the first input capacitor terminal 226 and the first reference node 224. The non-inverting amplifier input terminal 218 may be connected to the first reference node 224.

The multi-phase auto-zeroing amplifier circuitry 200 may include a switch controller circuitry 232. The switch controller circuitry 232 may be configured to provide control signals (shown in the timing diagram superimposed onto the switch controller circuitry 232 block) for controlling switches, such as the input auto-zero switch 214 and the first switch 206 and second switch 208. For clarity, the electrical connections between the switch controller circuitry 232 and the switches being controlled by the switch controller circuitry 232 is not shown.

For example, the first switch 206 and the second switch 208 may be used to operate an autozero phase that can include multiple sub-phases of the autozero phase, such as a first sub-phase and a second sub-phase. During a first sub-phase of the auto-zero phase, the input auto-zero switch 214 and the first switch 206 and second switch 208 are turned on. This allows storage of a relatively "coarser" amplifier input offset voltage compensation charge onto the input capacitor 204. Then, during a second sub-phase of the auto-zero phase, the first switch 206 can be turned off before turning off the second switch 208. Turning the second switch 208 off allows storage of a relatively "finer" amplifier input offset voltage compensation charge on the input capacitor 204 via the first auto-zero capacitor 210.

The first auto-zero capacitor 210 may be substantially smaller in capacitance value than the input capacitor 204, while the second auto-zero capacitor 212 may be of similar capacitance value as the input capacitor 204. For example, the first auto-zero capacitor 210 may have a capacitance value that is less than or equal to ⅕ of a capacitance value of the input capacitor 204, and the second auto-zero capacitor 212 may have a capacitance value that is equal to that of the input capacitor 204 or within a range of between 0.5 times and 2 times the capacitance value of the input capacitor 204. During the second sub-phase of the auto-zero phase, a transfer function $C_{210}/(C_{204}+C_{210})$ from the first intermediate node 222 to the inverting amplifier input node 216 may be less than or equal to ⅙.

After both sub-phases of the autozeroing phase are completed, the switch controller circuitry 232 can turn off the input auto-zero switch 214 and the second switch 208. Then, an input signal switch 234 may be turned on to couple the input signal of interest to the first input capacitor terminal 226 of the input capacitor 204. Also, an output switch 236 may then be turned on to couple the amplifier output terminal 220 such as to provide a closed-loop feedback path between the inverting amplifier input terminal 216 and the amplifier output terminal 220 through the integration capacitor 238.

Comparing the approach of FIG. 2 to the approach in FIG. 1, the approach in FIG. 2 can include multiple switches 206, 208, corresponding to the multiple auto-zero sub-phases, instead of a single switch in the auto-zeroing feedback path from the amplifier output terminal 220 to the inverting amplifier input terminal 216. The approach in FIG. 2 also includes two additional capacitors: first auto-zero capacitor 210 and second auto-zero capacitor 212. The multi-phase auto-zeroing amplifier circuitry 200 also introduces an additional "sub-phase" into the timing control provided by the switch controller circuitry 232, separating the initial auto-zero phase (pictured in FIG. 1) into multiple sequential steps. In the approach of FIG. 2, at the end of the first sub-phase of the auto-zero phase, the input capacitor 204 will have impressed on it a relatively coarser approximation of the amplifier input-referred offset voltage. For the second sub-phase of the auto-zero phase, the first switch 206 may be switched off.

At this beginning of the second sub-phase of the auto-zero phase, the input capacitor 204 may be subject to pedestal and noise errors. But even with the first switch 206 off, the negative feedback in the auto-zero path around the amplifier 202 remains active, though now with an attenuation. The transfer function from the first intermediate node 222 to the inverting amplifier input terminal 216 is only $C_{210}/(C_{204}+C_{210})$, which is well below unity. During the second sub-phase of the auto-zero phase, the amplifier 202 will again drive the input capacitor 204 voltage toward cancelling or compensating for the residual input offset voltage errors. At the end of the second auto-zero sub-phase, the second switch 208 may be turned off, thereby sampling the voltage at the amplifier output terminal 220 onto the second auto-zero capacitor 212. As before, pedestal and sampling noise errors may appear on the second auto-zero capacitor 212. However, in the multi-phase auto-zeroing amplifier circuitry 200 approach of FIG. 2, the referred-to-input error during the second sub-phase of the autozero phase is attenuated by the above transfer function, $C_{210}/(C_{204}+C_{210})$, leading to an improvement in auto-zero accuracy.

Figure 3:
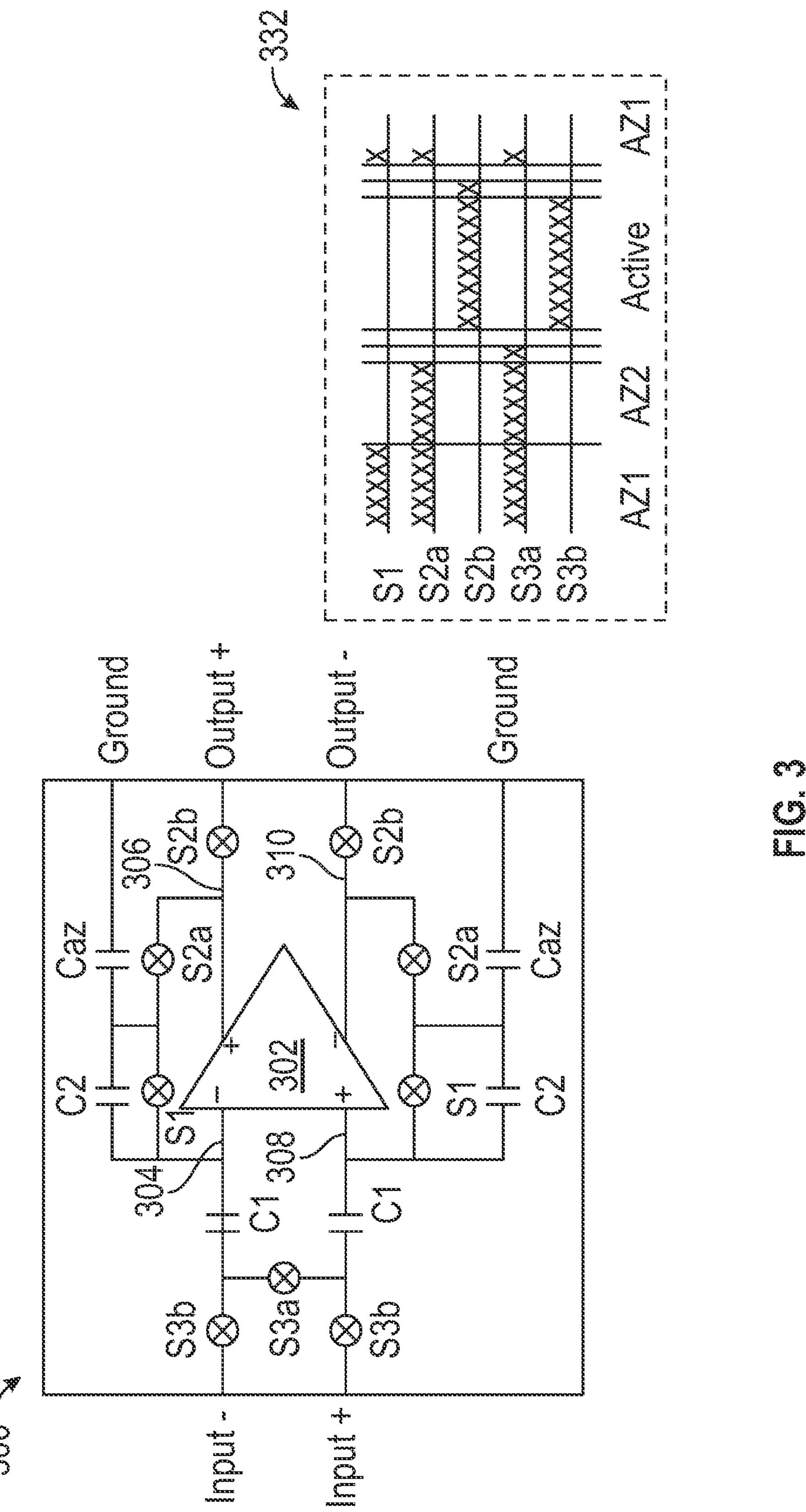
FIG. 3 illustrates a differential embodiment of the multi-phase auto-zeroing amplifier circuitry with timing control.

FIG. 3 illustrates a differential embodiment of multi-phase auto-zeroing amplifier circuitry 300 with timing control provided by switch controller circuitry 332. Although the above description of FIG. 2 focused on a single-ended enhanced auto-zero circuit, for illustrative clarity, a differential approach can similarly be implemented, such as shown in FIG. 3. The single-ended output amplifier 202 of FIG. 2 may be substituted by a differential-output amplifier 302. A first auto-zeroing network can be configured to be associated in a negative feedback configuration with a first input terminal 304 and a first output terminal 306 of the differential amplifier 302. A second auto-zeroing network can optionally be included, and can be configured to be associated in a negative feedback configuration with a second input terminal 308 and a second output terminal 310 of the differential amplifier 302, wherein the second auto-zeroing network can include like componentry to that of the first auto-zeroing network.

Figure 4:
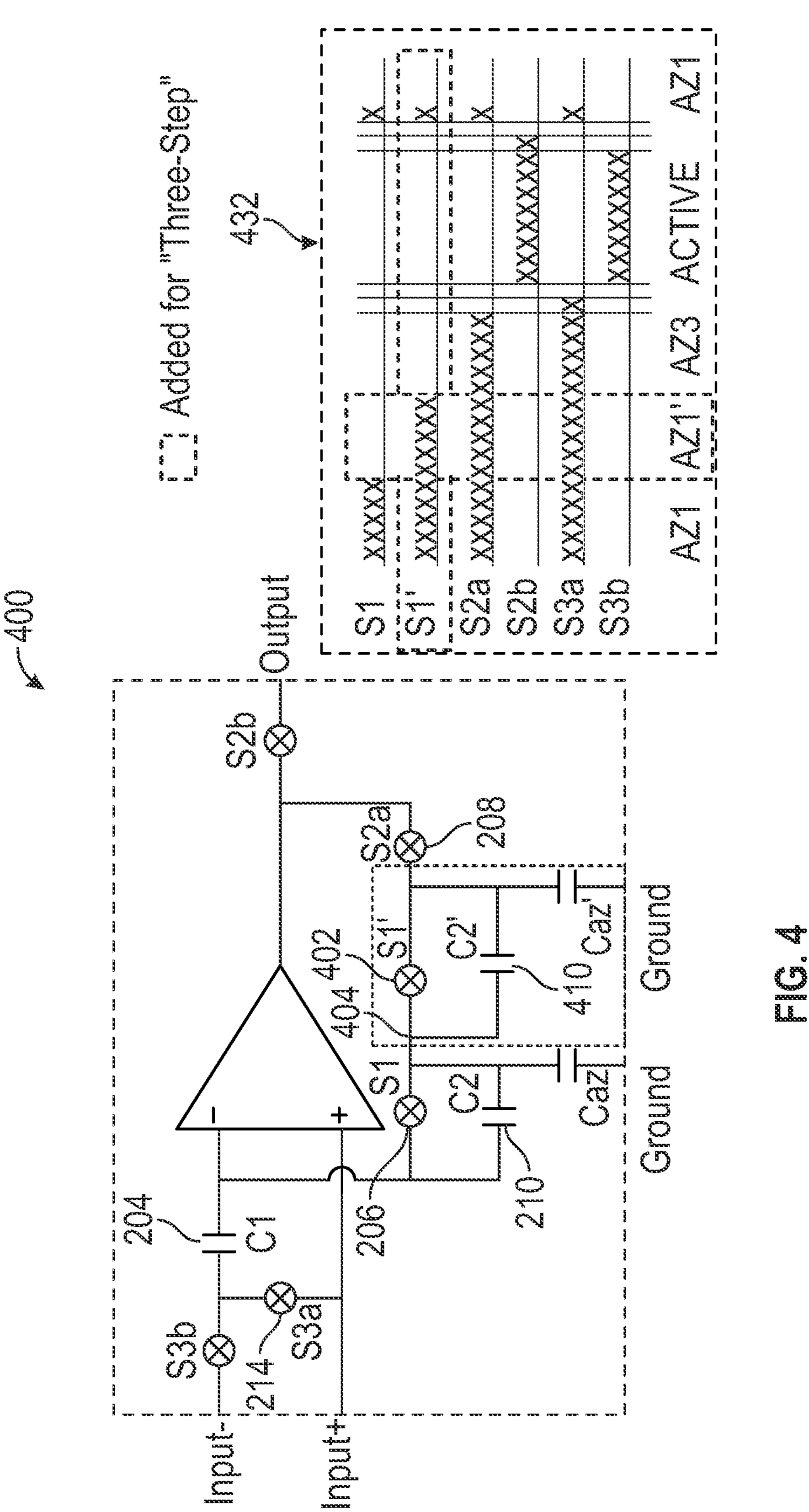
FIG. 4 illustrates another schematic diagram of the multi-phase auto-zeroing amplifier circuitry with timing control.

FIG. 4 illustrates another schematic diagram of the multi-phase auto-zeroing amplifier circuitry 400 with timing control provided by switch controller circuitry 432. The multi-phase auto-zeroing amplifier circuitry 200 may further include a third switch 402, the third switch 402 defining a second intermediate node 404 in the series arrangement. The switch controller circuitry 432 can be configured to also provide a control signal for controlling the third switch 402, such that during a first sub-phase of an auto-zero phase, the input auto-zero switch 214 and the first switch 206, the second switch 208, and the third switch 402 can be turned on to store a relatively coarser amplifier input offset voltage compensation charge on the input capacitor 204. Then, during a second sub-phase of the auto-zero phase, the first switch 206 can be turned off before first turning off the third switch 402 to store a relatively finer amplifier input offset voltage compensation charge on the input capacitor 204 via the first auto-zero capacitor 210, and then turning off the second switch 208 to store a relatively still even finer input offset voltage compensation charge on the input capacitor 204 via the first auto-zero capacitor 210 and via a further auto-zero capacitor 410. While FIG. 4 depicts an example of auto-zeroing using three subphases of the auto-zeroing phase (as compared to the two subphases of the auto-zeroing phase shown in FIG. 2), the approach shown in FIG. 4 can be extended to further sub-phases in a similar manner, if desired. However, the approach shown in FIG. 4 may not be necessary, since the improvement shown by the approach shown in FIG. 2 may likely be sufficient. The approach shown in FIG. 4 can also similarly be applied to a differential output amplifier, such as is shown in FIG. 3.

Figure 5:
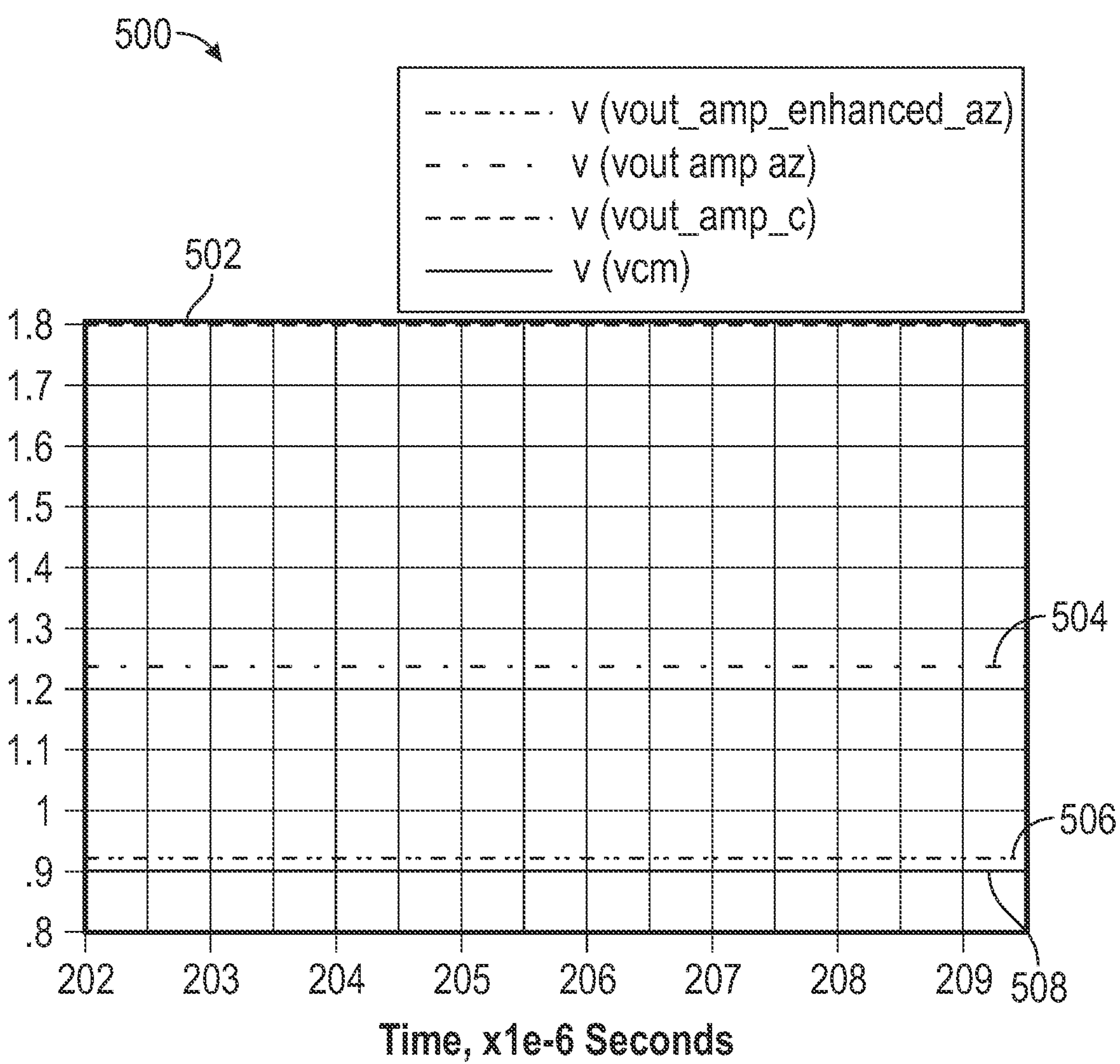
FIG. 5 is a computer-simulated graph of voltage vs. time from a computer-simulation of circuitry such as shown in FIG. 2.

FIG. 5 is a computer-simulated graph of voltage vs. time from a computer-simulation of circuitry such as shown in FIG. 2. To highlight the effects of the multi-phase auto-zeroing amplifier circuitry 200, several computerized circuit simulations were performed. The computerized circuit simulations were performed using a negative-feedback amplifier with a closed-loop gain of 100. The simulated amplifier was chosen to have an open-loop gain of 72 dB and 40 mV of input offset voltage, and the capacitors were of values $C_{204}$=500 fF, $C_{210}$=25 fF, and $C_{212}$=500 fF.

FIG. 5 shows a graph of the results of the simulation. In FIG. 5, the trace 502 represents no auto-zero, the trace 504 represents the auto-zero from the approach shown in FIG. 1, and the trace 506 represents the enhanced auto-zero from the multi-phase auto-zeroing amplifier circuitry 200 from the approach similar to that shown in FIG. 2. The null input voltage trace 508 (and also the auto-zero reference potential) was 900 mV. FIG. 5 shows that when there is no auto-zero, as depicted by the trace 502, the output voltage at the node 220 is equal to the voltage at the 1.8V supply rail, as would be expected by multiplying the input offset voltage by the open-loop amplifier gain (40 mV*100). For auto-zeroing using the approach shown in FIG. 1, the output voltage at the amplifier output terminal 220 is shown by the trace 504 as being approximately 1.24V, which corresponds a derived input-referred offset voltage that is reduced from 40 mV to 3.35 mV. When using the multiple subphase auto-zeroing approach shown in FIG. 2, the trace 506 shows the output voltage at the amplifier output node 220 being just above the reference potential of 900 mV, which represents the derived input-referred offset being further reduced to just 0.22 mV. These particular values are illustrative, and may vary depending on the chosen capacitor values and FET switch parasitic parameters.

Figure 6A:
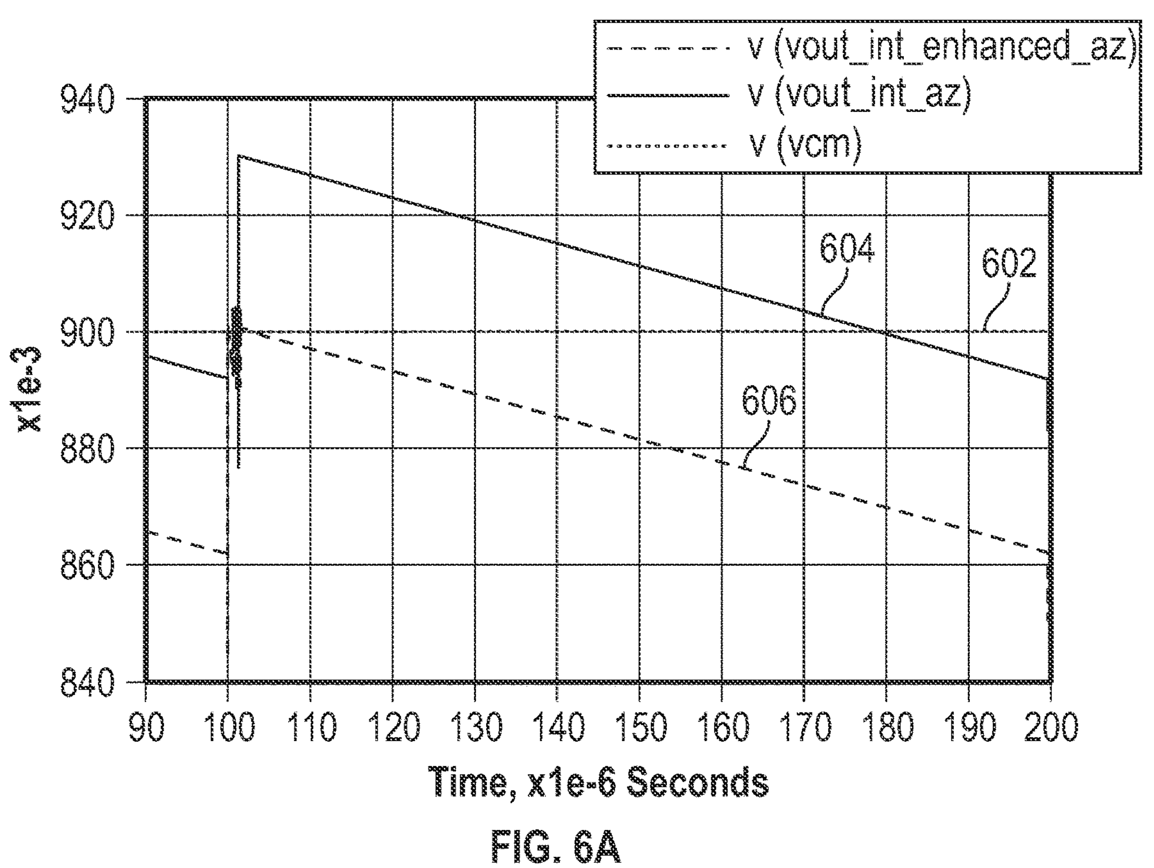
FIG. 6A illustrates a simulated aspect of the subject matter validating the advantages of the enhanced auto-zero circuit as compared to other auto-zero circuits.
Figure 6B:
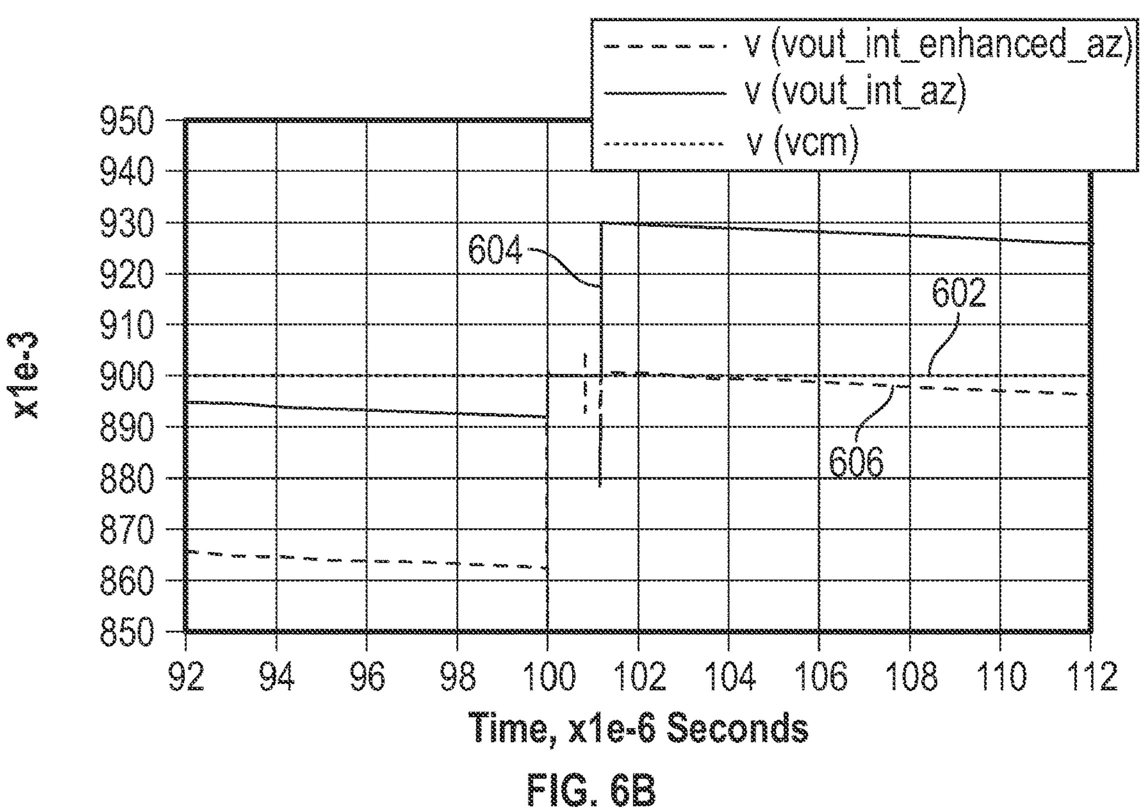
FIG. 6B illustrates a "zoomed-in" view of the simulation from FIG. 6A which depicts the sub-system output of the enhanced auto-zero circuit as compared to other auto-zero circuits.

FIGS. 6A-6B are voltage vs. time graphs that illustrate a computer-simulation of the enhanced auto-zero circuit of FIG. 2, as compared to other auto-zero approaches, such as that shown in FIG. 1. To further validate the advantages of the multi-phase auto-zeroing amplifier circuitry 200 of FIG. 2, several computerized circuit simulations of an integrator sub-system were performed. The simulations were performed using a "realistic and imperfect" amplifier that was used with auto-zero circuitry such as that illustrated in FIG. 2. The amplifier parameters included a gain of 72 dB and an input offset voltage of 40 mV.

In FIG. 6A and FIG. 6B, the trace 604 illustrates an example of the output voltage of the integrator from the approach shown in FIG. 1, the trace 606 illustrates an example of using the enhanced auto-zero approach of FIG. 2, and the trace 602 illustrates the integrator reset potential of 900 mV. FIG. 6B illustrates a "zoomed-in" view of the simulation from FIG. 6A which demonstrates dramatic improvement in the integrator "reset" voltage using the approach of FIG. 2. Additionally, the output transients denoting the first sub-phase of the auto-zero phase and the second sub-phase of the auto-zero phase of the multi-phase auto-zeroing amplifier circuitry 200 are represented in FIG. 6B.

FIG. 7 illustrates a flow diagram 700 of portions of a method of auto-zeroing an amplifier using multiple (e.g., two or more) auto-zero sub-phases to compensate for an input offset voltage of the amplifier. At 720, during a first sub-phase of an auto-zero phase, an amplifier output terminal 220 can be coupled to an inverting amplifier input terminal 216 via a first switch 206 and a second switch 208. Turning off the first switch 206 stores a relatively coarser amplifier input voltage compensation charge on the input capacitor 204 that is coupled to the inverting amplifier input terminal 216. At 740, during a second sub-phase of the auto-zero phase, the second switch 208 can then be turned off to store a relatively finer amplifier input offset voltage compensation charge on the input capacitor 204 via the first auto-zero capacitor 210.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B"

includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. Multi-phase auto-zeroing amplifier circuitry comprising:

an amplifier comprising an inverting amplifier input terminal, a non-inverting amplifier input terminal, and an amplifier output terminal;

a first auto-zeroing network, comprising:

an input capacitor, having a first input capacitor terminal and a second input capacitor terminal, the second input capacitor terminal coupled to the inverting amplifier input terminal;

first and second switches, in a series arrangement between the inverting amplifier input terminal and the amplifier output terminal to define a first intermediate node between the first and second switches;

a first auto-zero capacitor, connected between the inverting amplifier input terminal and the first intermediate node;

a second auto-zero capacitor, connected between the first intermediate node and a first reference node; and an input auto-zero switch, coupled between the first input capacitor terminal and a second reference node, wherein the non-inverting amplifier input terminal is connected to the second reference node; and switch controller circuitry, configured to provide control signals for controlling the input auto-zero switch and the first and second switches, wherein during a first sub-phase of an auto-zero phase, the input auto-zero switch and the first and second switches are turned on to store an amplifier input offset coarser compensation charge on the input capacitor, and wherein during a second sub-phase of the auto-zero phase, the first switch is turned off before turning off the second switch to store an amplifier input offset finer compensation charge on the input capacitor via the first auto-zero capacitor.

2. The multi-phase auto-zeroing amplifier circuitry of claim 1, wherein:

the first auto-zero capacitor has a capacitance value that is less than or equal to ⅕ of a capacitance value of the input capacitor; and the second auto-zero capacitor has a capacitance value that is within a range of between 0.5 times and 2 times the capacitance value of the input capacitor.

3. The multi-phase auto-zeroing amplifier circuitry of claim 2, wherein, during the second sub-phase of the auto-zero phase, a transfer function from the first intermediate node to the inverting amplifier input terminal is less than or equal to ⅙.

4. The multi-phase auto-zeroing amplifier circuitry of claim 1, further comprising:

an input signal switch, coupled to the first input capacitor terminal, and configured to be controlled by the switch controller circuitry to turn on, after the second sub-phase of the auto-zero phase is complete, to couple an input signal to the first input capacitor terminal; and an output switch, coupled to the amplifier output terminal, and configured to be controlled by the switch controller circuitry to turn on, upon or after completion of the second sub-phase of the auto-zero phase is complete, to provide an output signal, wherein there is a first closed-loop feedback path between the inverting amplifier input terminal and the amplifier output terminal during each of the first sub-phase and the second sub-phase of the auto-zero phase; and wherein the switch controller circuitry is configured to turn off the input auto-zero switch and to turn off the second switch upon or after completion of the second sub-phase of the auto-zero phase.

5. The multi-phase auto-zeroing amplifier circuitry of claim 4, wherein:

the amplifier is configured as one of a transconductance amplifier stage or a transimpedance amplifier stage; and the input signal is received as an input current signal from a current mode sensor.

6. The multi-phase auto-zeroing amplifier circuitry of claim 4, further comprising an integration capacitor included in a second closed-loop feedback path between the amplifier inverting input terminal and the amplifier output terminal.

7. The multi-phase auto-zeroing amplifier circuitry of claim 1, wherein:

the series arrangement further comprises a third switch, defining a second intermediate node in the series arrangement; and the switch controller circuitry is configured to provide a control signal for controlling the third switch, wherein during a first sub-phase of an auto-zero phase, the input auto-zero switch and the first, second, and third switches are turned on, and wherein during a second sub-phase of the auto-zero phase, the first switch is turned off to store a relatively coarser input offset voltage compensation charge on the input capacitor before then turning off the third switch to store a relatively finer amplifier input offset compensation charge on the input capacitor via the first auto-zero capacitor, and wherein during a third sub-phase of the auto-zero phase the second switch is turned off before then turning off the third switch to store a relatively even finer input offset voltage compensation charge on the input capacitor via at least the first auto-zero capacitor.

8. The multi-phase auto-zeroing circuitry of claim 1, wherein the amplifier is a differential amplifier, wherein the first auto-zeroing network is configured to be associated in a negative feedback configuration with a first input terminal and a first output terminal of the differential amplifier, and further comprising a second auto-zeroing network that is configured to be associated in a negative feedback configuration with a second input terminal and a second output terminal of the differential amplifier, wherein the second auto-zeroing network includes like componentry to that of the first auto-zeroing network.

9. A method of auto-zeroing an amplifier to compensate for an input offset voltage of the amplifier, the method comprising:

during a first sub-phase of an auto-zero phase, coupling an amplifier output terminal to an inverting amplifier input terminal via a first switch and a second switch arranged in series to store a relatively coarser amplifier input voltage compensation charge on an input capacitor that is coupled to the inverting amplifier input terminal; and during a second sub-phase of an auto-zero phase, turning off the first switch before turning off the second switch to store a relatively finer amplifier input offset voltage compensation charge on the input capacitor via a first auto-zero capacitor.

10. The method of claim 9, further comprising a switch controller circuitry configured to provide control signals for controlling an input auto-zero switch and the first switch and second switch.

11. The method of claim 10, further comprising:

during the first sub-phase of the auto-zero phase, turning on the input auto-zero switch.

12. The method of claim 10, further comprising:

operating first switch and second switch in a series arrangement between the inverting amplifier input terminal and the amplifier output terminal to define a first intermediate node between the first switch and second switch;

coupling a second auto-zero capacitor between the first intermediate node and a first reference node.

13. The method of claim 12, wherein:

the first auto-zero capacitor has a capacitance value that is less than or equal to ⅕ of a capacitance value of the input capacitor; and the second auto-zero capacitor has a capacitance value that is within a range of between 0.5 times and 2 times the capacitance value of the input capacitor.

14. The method of claim 13, wherein, during the second sub-phase of the auto-zero phase, a transfer function from the first intermediate node to the inverting amplifier input terminal is less than or equal to ⅙.

15. The method of claim 10, further comprising:

turning on an input signal switch coupled to a first input capacitor terminal, after the second sub-phase of the auto-zero phase is complete, to couple an input signal to the first input capacitor terminal; and turning on an output switch coupled to the amplifier output terminal, upon or after completion of the second sub-phase of the auto-zero phase, to provide an output signal and to provide a closed-loop feedback path between the inverting amplifier input terminal and the amplifier output terminal; and configuring the switch controller circuitry to turn off the input auto-zero switch and the second switch upon or after completion of the second sub-phase of the auto-zero phase.

16. The method of claim 15, further comprising:

operating the amplifier as a transimpedance amplifier stage; and receiving the input signal as an input current signal from a current mode sensor.

17. The method of claim 15, further comprising:

coupling an integration capacitor in the closed-loop feedback path between the amplifier inverting input terminal and the amplifier output terminal.

18. The method of claim 12, wherein:

the series arrangement further comprises a third switch, defining a second intermediate node in the series arrangement; and during a first sub-phase of an auto-zero phase, the input auto-zero switch and the first, second, and third switches are turned on before turning off the first switch to store a relatively coarser amplifier input offset voltage compensation charge on the input capacitor;

during a second sub-phase of the auto-zero phase, after the first switch is turned off, then turning off the third switch to store a relatively finer amplifier input offset voltage compensation charge on the input capacitor;

during a third sub-phase of the auto-zero phase, after the third switch is turned off, then turning off the second switch to store a relatively further finer input offset voltage compensation charge on the input capacitor.

19. A method of auto-zeroing an amplifier to compensate for an input offset voltage of the amplifier, the method comprising:

during a first sub-phase of an auto-zero phase, coupling an amplifier output terminal to an inverting amplifier input terminal via a first switch and a second switch arranged in series and then turning off the first switch to store a relatively coarser amplifier input offset voltage compensation charge on an input capacitor that is coupled to the inverting amplifier input terminal;

during a second sub-phase of the auto-zero phase, after turning off the first switch turning off the second switch to store a relatively finer input offset voltage compensation charge on the input capacitor via a first auto-zero capacitor, wherein the first auto-zero capacitor has a capacitance value that is less than or equal to ⅕ of a capacitance value of the input capacitor.

20. The method of claim 19, wherein, during the second sub-phase of the auto-zero phase, a transfer function from a first intermediate node, between the first and second switches, to the inverting amplifier input terminal is less than or equal to ⅙.

* * * * *